(12) United States Patent
Kister

(10) Patent No.: US 8,230,593 B2
(45) Date of Patent: Jul. 31, 2012

(54) PROBE BONDING METHOD HAVING IMPROVED CONTROL OF BONDING MATERIAL

(75) Inventor: January Kister, Portola Valley, CA (US)

(73) Assignee: MicroProbe, Inc., Carlsbad, CA (US)

( * ) Notice: Subject to any disclaimer, the term of this patent is extended or adjusted under 35 U.S.C. 154(b) by 929 days.

(21) Appl. No.: 12/156,131

(22) Filed: May 29, 2008

(65) Prior Publication Data

US 2009/0293274 A1 Dec. 3, 2009

(51) Int. Cl.
*H01R 43/00* (2006.01)
(52) U.S. Cl. ............. 29/884; 29/848; 29/851; 29/876; 29/883; 324/756.03; 439/591
(58) Field of Classification Search ............ 29/846, 29/848, 851, 855, 876, 877, 883, 884; 264/263, 264/276; 324/750.25, 754.03, 755.11, 756.03; 438/66, 67, 91, 591
See application file for complete search history.

(56) References Cited

U.S. PATENT DOCUMENTS

| | | | |
|---|---|---|---|
| 3,518,612 A | 6/1970 | Dunman et al. |
| 3,599,093 A | 8/1971 | Oates |
| 3,710,251 A | 1/1973 | Hagge et al. |
| 3,812,311 A | 5/1974 | Kvaternik |
| 4,027,935 A | 6/1977 | Byrnes et al. |
| 4,115,736 A | 9/1978 | Tracy |
| 4,116,523 A | 9/1978 | Coberly et al. |
| 4,423,376 A | 12/1983 | Byrnes et al. |
| 4,525,697 A | 6/1985 | Jones et al. |
| 4,532,423 A | 7/1985 | Tojo et al. |
| 4,567,433 A | 1/1986 | Ohkubo et al. |
| 4,593,961 A | 6/1986 | Cosmo |
| 4,618,767 A | 10/1986 | Smith et al. |
| 4,618,821 A | 10/1986 | Lenz |
| 4,706,019 A | 11/1987 | Richardson |
| 4,730,158 A | 3/1988 | Kasai et al. |
| 4,747,698 A | 5/1988 | Wickramasinghe et al. |

(Continued)

FOREIGN PATENT DOCUMENTS

DE 4237591 A1 5/1994

(Continued)

OTHER PUBLICATIONS

Sporck, Nicholas, "A New Probe Card Technology Using Compliant Microsprings", *Proceedings 1997 IEEE International Test Conference* Nov. 1, 1997, 527-532.

(Continued)

*Primary Examiner* — Donghai D. Nguyen
(74) *Attorney, Agent, or Firm* — Deborah A. Peacock; Samantha A. Updegraff; Peacock Myers, P.C.

(57) ABSTRACT

In assembly of probe arrays for electrical test, a problem can arise where a bonding agent undesirably wicks between probes. According to embodiments of the invention, this wicking problem is alleviated by disposing an anti-wicking agent on a surface of the probe assembly such that wicking of the bonding agent along the probes toward the probe tips is hindered. The anti-wicking agent can be a solid powder, a liquid, or a gel. Once probe assembly fabrication is complete, the anti-wicking agent is removed. In preferred embodiments, a template plate is employed to hold the probe tips in proper position during fabrication. In this manner, undesirable bending of probes caused by introduction or removal of the anti-wicking agent can be reduced or eliminated.

28 Claims, 3 Drawing Sheets

U.S. PATENT DOCUMENTS

| | | | |
|---|---|---|---|
| 4,757,255 A | 7/1988 | Margozzi |
| 4,772,846 A | 9/1988 | Reeds |
| 4,773,877 A | 9/1988 | Kruger et al. |
| 4,807,159 A | 2/1989 | Komatsu et al. |
| 4,901,013 A | 2/1990 | Benedetto et al. |
| 4,967,148 A | 10/1990 | Doemens et al. |
| 5,015,947 A | 5/1991 | Chism |
| 5,026,291 A | 6/1991 | David |
| 5,030,318 A | 7/1991 | Reche |
| 5,061,192 A | 10/1991 | Chapin et al. |
| 5,067,007 A | 11/1991 | Otsuka et al. |
| 5,145,384 A | 9/1992 | Asakawa et al. |
| 5,205,739 A | 4/1993 | Malo et al. |
| 5,207,585 A | 5/1993 | Byrnes et al. |
| 5,225,771 A | 7/1993 | Leedy |
| 5,230,632 A | 7/1993 | Baumberger et al. |
| 5,237,743 A | 8/1993 | Busacco et al. |
| 5,354,205 A | 10/1994 | Feigenbaum et al. |
| 5,399,982 A | 3/1995 | Driller |
| 5,422,574 A | 6/1995 | Kister |
| 5,430,614 A | 7/1995 | Difrancesco |
| 5,436,571 A | 7/1995 | Karasawa |
| 5,476,211 A | 12/1995 | Khandros |
| 5,531,022 A | 7/1996 | Beaman et al. |
| 5,576,631 A | 11/1996 | Stowers et al. |
| 5,632,631 A | 5/1997 | Fjelstad et al. |
| 5,635,846 A | 6/1997 | Beaman et al. |
| 5,644,249 A | 7/1997 | Kister |
| 5,676,599 A | 10/1997 | Ricks et al. |
| 5,701,085 A | 12/1997 | Malladi et al. |
| 5,720,098 A | 2/1998 | Kister |
| 5,742,174 A | 4/1998 | Kister et al. |
| 5,751,157 A | 5/1998 | Kister |
| 5,764,070 A | 6/1998 | Pedder |
| 5,764,072 A | 6/1998 | Kister |
| 5,764,409 A | 6/1998 | Colvin |
| 5,767,691 A | 6/1998 | Verkuil |
| 5,772,451 A | 6/1998 | Dozier, II et al. |
| 5,773,987 A | 6/1998 | Montoya |
| 5,802,699 A | 9/1998 | Fjelstad et al. |
| 5,806,181 A | 9/1998 | Khandros et al. |
| 5,821,763 A | 10/1998 | Beamann et al. |
| 5,829,128 A | 11/1998 | Eldridge et al. |
| 5,832,601 A | 11/1998 | Eldridge et al. |
| 5,847,936 A | 12/1998 | Forehand et al. |
| 5,852,871 A | 12/1998 | Khandros |
| 5,864,946 A | 2/1999 | Eldridge et al. |
| 5,884,395 A | 3/1999 | Dabrowiecki et al. |
| 5,892,539 A | 4/1999 | Colvin |
| 5,914,613 A | 6/1999 | Gleason et al. |
| 5,917,707 A | 6/1999 | Khandros et al. |
| 5,923,178 A | 7/1999 | Higgins et al. |
| 5,926,951 A | 7/1999 | Khandros et al. |
| 5,932,323 A | 8/1999 | Throssel |
| 5,934,914 A | 8/1999 | Fjelstad et al. |
| 5,936,421 A | 8/1999 | Stowers et al. |
| 5,945,836 A | 8/1999 | Sayre et al. |
| 5,952,843 A | 9/1999 | Vinh |
| 5,969,533 A | 10/1999 | Takagi |
| 5,970,167 A | 10/1999 | Colvin |
| 5,974,662 A | 11/1999 | Eldridge et al. |
| 5,994,152 A | 11/1999 | Khandros et al. |
| 6,027,630 A | 2/2000 | Cohen |
| 6,029,344 A | 2/2000 | Khandros et al. |
| 6,031,282 A | 2/2000 | Jones et al. |
| 6,064,215 A | 5/2000 | Kister |
| 6,066,957 A | 5/2000 | Van Loan et al. |
| 6,071,630 A | 6/2000 | Tomaru et al. |
| 6,086,386 A | 7/2000 | Fjelstad et al. |
| 6,133,072 A | 10/2000 | Fjelstad |
| 6,184,576 B1 | 2/2001 | Jones et al. |
| 6,204,674 B1 | 3/2001 | Dabrowiecki et al. |
| 6,205,660 B1 | 3/2001 | Fjelstad et al. |
| 6,215,320 B1 | 4/2001 | Parrish |
| 6,218,203 B1 | 4/2001 | Khoury et al. |
| 6,246,245 B1 | 6/2001 | Akram et al. |
| 6,246,247 B1 | 6/2001 | Eldridge et al. |
| 6,247,228 B1 | 6/2001 | Distefano et al. |
| 6,255,126 B1 | 7/2001 | Mathieu et al. |
| 6,259,261 B1 | 7/2001 | Engelking et al. |
| 6,278,284 B1 | 8/2001 | Mori et al. |
| 6,292,003 B1 | 9/2001 | Fredrickson et al. |
| 6,334,247 B1 | 1/2002 | Beaman et al. |
| 6,336,269 B1 | 1/2002 | Eldridge et al. |
| 6,344,753 B1 | 2/2002 | Takada et al. |
| 6,411,112 B1 | 6/2002 | Das et al. |
| 6,419,500 B1 | 7/2002 | Kister |
| 6,420,887 B1 | 7/2002 | Kister et al. |
| 6,424,164 B1 | 7/2002 | Kister |
| 6,433,571 B1 | 8/2002 | Montoya |
| 6,437,584 B1 | 8/2002 | Gleason et al. |
| 6,441,315 B1 | 8/2002 | Eldridge et al. |
| 6,443,784 B1 | 9/2002 | Kimoto |
| 6,482,013 B2 | 11/2002 | Eldridge et al. |
| 6,483,328 B1 | 11/2002 | Eldridge et al. |
| 6,486,689 B1 | 11/2002 | Nishikawa |
| 6,496,026 B1 | 12/2002 | Long et al. |
| 6,525,552 B2 | 2/2003 | Kister |
| 6,529,021 B1 | 3/2003 | Yu et al. |
| 6,530,148 B1 | 3/2003 | Kister |
| 6,566,898 B2 | 5/2003 | Theissen et al. |
| 6,570,396 B1 | 5/2003 | Kister |
| 6,573,738 B1 | 6/2003 | Matsuo et al. |
| 6,575,767 B2 | 6/2003 | Satoh et al. |
| 6,576,485 B2 | 6/2003 | Zhou et al. |
| 6,586,955 B2 | 7/2003 | Fjelstad et al. |
| 6,615,485 B2 | 9/2003 | Eldridge et al. |
| 6,624,648 B2 | 9/2003 | Eldridge et al. |
| 6,633,176 B2 | 10/2003 | Takemoto et al. |
| 6,641,430 B2 | 11/2003 | Zhou et al. |
| 6,646,455 B2 | 11/2003 | Maekawa et al. |
| 6,676,438 B2 | 1/2004 | Zhou et al. |
| 6,677,245 B2 | 1/2004 | Zhou et al. |
| 6,690,185 B1 | 2/2004 | Khandros et al. |
| 6,707,311 B2 | 3/2004 | Hohenwarter |
| 6,727,719 B2 | 4/2004 | Liao et al. |
| 6,731,123 B2 | 5/2004 | Kimoto |
| 6,765,228 B2 | 7/2004 | Lin et al. |
| 6,825,422 B2 | 11/2004 | Eldridge et al. |
| 6,842,023 B2 | 1/2005 | Yoshida et al. |
| 6,847,221 B2 | 1/2005 | Kimoto et al. |
| 6,853,208 B2 | 2/2005 | Okubo et al. |
| 6,881,974 B2 | 4/2005 | Wood et al. |
| 6,890,185 B1 | 5/2005 | Kister et al. |
| 6,897,666 B2 | 5/2005 | Swettlen et al. |
| D507,198 S | 7/2005 | Kister |
| 6,917,102 B2 | 7/2005 | Zhou et al. |
| 6,917,525 B2 | 7/2005 | Mok et al. |
| D510,043 S | 9/2005 | Kister |
| 6,945,827 B2 | 9/2005 | Grube et al. |
| 6,956,389 B1 | 10/2005 | Mai |
| 6,965,244 B2 | 11/2005 | Miller |
| 6,965,245 B2 | 11/2005 | Kister et al. |
| 6,970,005 B2 | 11/2005 | Rincon et al. |
| 7,015,707 B2 | 3/2006 | Cherian |
| 7,036,221 B2 * | 5/2006 | Higashida et al. ............... 29/848 |
| 7,046,021 B2 | 5/2006 | Kister |
| 7,059,865 B2 | 6/2006 | Kister et al. |
| 7,064,564 B2 | 6/2006 | Kister et al. |
| D525,207 S | 7/2006 | Kister et al. |
| 7,071,715 B2 | 7/2006 | Shinde et al. |
| 7,073,254 B2 | 7/2006 | Eldridge et al. |
| 7,078,921 B2 | 7/2006 | Haga et al. |
| 7,088,118 B2 | 8/2006 | Liu et al. |
| 7,091,729 B2 | 8/2006 | Kister |
| 7,108,546 B2 | 9/2006 | Miller et al. |
| 7,109,731 B2 | 9/2006 | Gleason et al. |
| 7,143,500 B2 | 12/2006 | Byrd |
| 7,148,709 B2 | 12/2006 | Kister |
| 7,150,658 B1 | 12/2006 | Chien |
| 7,173,441 B2 | 2/2007 | Kister et al. |
| 7,189,078 B2 | 3/2007 | Kister et al. |
| 7,202,682 B2 | 4/2007 | Cooper et al. |
| 7,217,138 B2 | 5/2007 | Kister et al. |
| 7,218,127 B2 | 5/2007 | Cooper et al. |
| 7,218,131 B2 | 5/2007 | Tanioka et al. |
| 7,225,538 B2 | 6/2007 | Eldridge et al. |

| | | |
|---|---|---|
| 7,227,371 B2 | 6/2007 | Miller |
| 7,265,565 B2 | 9/2007 | Chen et al. |
| 7,274,195 B2 | 9/2007 | Takemoto et al. |
| 7,281,305 B1 * | 10/2007 | Iyer et al. ............ 29/855 |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 7,671,610 B2 | 3/2010 | Kister |
| 7,759,949 B2 | 7/2010 | Kister |
| 7,786,740 B2 | 8/2010 | Kister |
| 2001/0012739 A1 | 8/2001 | Grube et al. |
| 2001/0040460 A1 | 11/2001 | Beaman et al. |
| 2002/0070743 A1 | 6/2002 | Felici et al. |
| 2002/0125584 A1 | 9/2002 | Umehara et al. |
| 2002/0153913 A1 | 10/2002 | Okubo et al. |
| 2002/0190738 A1 | 12/2002 | Beaman et al. |
| 2002/0194730 A1 | 12/2002 | Shih et al. |
| 2003/0027423 A1 | 2/2003 | Zhou et al. |
| 2003/0116346 A1 | 6/2003 | Forster et al. |
| 2004/0036493 A1 | 2/2004 | Miller |
| 2004/0046579 A1 | 3/2004 | Chraft et al. |
| 2004/0104737 A1 | 6/2004 | Haga et al. |
| 2004/0119485 A1 | 6/2004 | Koch et al. |
| 2004/0239352 A1 | 12/2004 | Mizoguchi |
| 2005/0012513 A1 | 1/2005 | Cheng et al. |
| 2005/0179458 A1 | 8/2005 | Chen et al. |
| 2005/0184743 A1 | 8/2005 | Kimura |
| 2005/0189955 A1 | 9/2005 | Takemoto et al. |
| 2005/0189958 A1 | 9/2005 | Chen et al. |
| 2006/0033516 A1 | 2/2006 | Rincon et al. |
| 2006/0040417 A1 | 2/2006 | Eldridge et al. |
| 2006/0073712 A1 | 4/2006 | Suhir |
| 2006/0082380 A1 | 4/2006 | Tanioka et al. |
| 2006/0170440 A1 | 8/2006 | Sudin |
| 2006/0171425 A1 | 8/2006 | Lee et al. |
| 2007/0145989 A1 | 6/2007 | Zhu et al. |
| 2007/0167022 A1 | 7/2007 | Tsai et al. |
| 2008/0074132 A1 | 3/2008 | Fan et al. |
| 2009/0201041 A1 | 8/2009 | Kister |
| 2010/0109691 A1 | 5/2010 | Kister |
| 2010/0176832 A1 | 7/2010 | Kister |
| 2010/0182030 A1 | 7/2010 | Kister |
| 2010/0182031 A1 | 7/2010 | Kister |
| 2010/0289512 A1 | 11/2010 | Kister |
| 2011/0006796 A1 | 1/2011 | Kister |
| 2011/0062978 A1 | 3/2011 | Kister |
| 2011/0273198 A1 | 11/2011 | Kister |
| 2011/0273199 A1 | 11/2011 | Kister |

FOREIGN PATENT DOCUMENTS

| | | |
|---|---|---|
| EP | 0144682 | 6/1985 |
| EP | 0764352 | 5/2004 |
| JP | 63-307678 | 12/1988 |
| JP | 01128535 | 5/1989 |
| JP | 7-021968 | 1/1995 |
| JP | 7-333232 | 12/1995 |
| JP | 10-506238 | 6/1998 |
| JP | 10-221374 | 8/1998 |
| JP | 11241690 | 8/1999 |
| WO | WO 8704568 | 7/1987 |
| WO | WO92/10010 | 6/1992 |
| WO | WO 96/15458 | 5/1996 |
| WO | WO96/37332 | 11/1996 |
| WO | WO97/43653 | 11/1997 |
| WO | WO01/09623 | 2/2001 |

OTHER PUBLICATIONS

Levy, Larry, "Water Probe TM System", *Southwest Workshop* formfactor inc. Jun. 1997, 1-19.

* cited by examiner

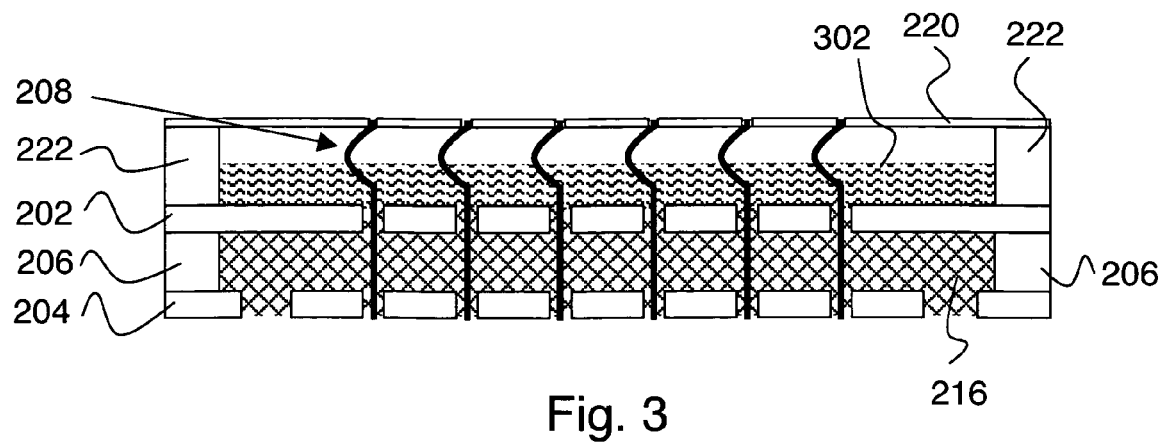
Fig. 3
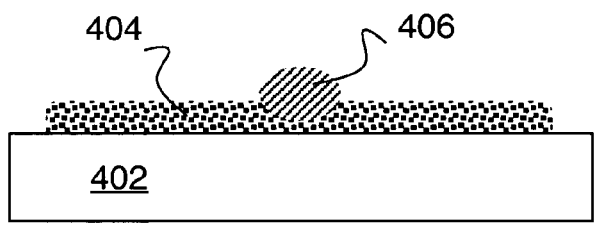 
Fig. 4a          Fig. 4b
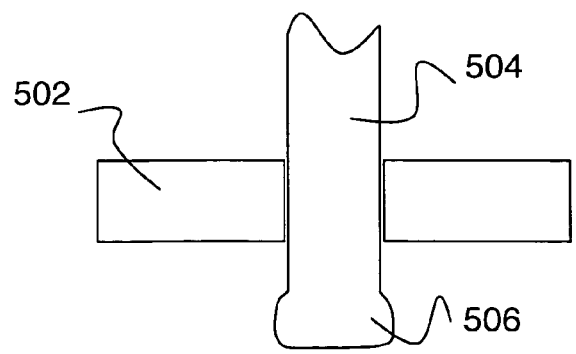
Fig. 5

PROBE BONDING METHOD HAVING IMPROVED CONTROL OF BONDING MATERIAL

FIELD OF THE INVENTION

This invention relates to probe assemblies for making temporary electrical contact to devices or circuits under test.

BACKGROUND

Probes and probe arrangements for making temporary electrical contact to devices or circuits under test have been in widespread use for many years. Accordingly, many aspects of this technology have been developed. Although much of this technological development has focused on details pertaining to the probes, other aspects of probe technology have also been considered. More specifically, probes are typically attached to a probe card, or some other form of substrate, and some work has focused on improvements relating to the probe card/substrate.

For example, in U.S. Pat. No. 6,881,974, a probe card manufacturing approach which starts by forming blind holes in a substrate and filling these holes with an electrically conductive metal is considered. After subsequent processing, part of the metal in the blind holes is exposed to form the probe pins. In U.S. Pat. No. 6,259,261, a probe assembly is considered where a selector card can be employed to determine the pin pattern of the probing card. In U.S. Pat. No. 6,566,898, a multi-layer probe card substrate having an improved thermal expansion match to silicon is considered. In U.S. Pat. No. 6,586,955, a probe assembly having cavities filled with a low melting point metal, which are individually electrically connected to probe tips, is considered. By including a molten or near-molten metal section in each probe, metal fatigue in the probes can be alleviated, and cracking can be avoided or rendered less harmful by self-healing.

However, as integrated circuit technology continues to develop, it is necessary to probe at increasingly fine probe pitch (i.e., reduced probe spacing). This evolution can generate problems that have not apparently arisen in connection with electrical probing before, and which require new solutions.

SUMMARY

One such problem is shown in the example of FIGS. 1a-d. FIG. 1a shows a probe assembly 104 having probes 102 fixed in position by a bonding material 106 (e.g., epoxy). This kind of probe bonding approach has been considered in U.S. Pat. No. 7,345,492, issued to the present inventor, and incorporated herein by reference in its entirety. It has been found that a wicking problem can arise in connection with this probe bonding approach, as shown on FIG. 1b. Throughout this application, "wicking" refers to situations where bonding material ends up being disposed between probes at locations (e.g., 108 on FIG. 1b) outside the main bonding cavity of the probe assembly. This wicking is highly undesirable because it typically interferes with proper probe motion during operation.

In investigations to date, wicking has most commonly been observed in irregular probe arrays (e.g., probe array 112 on FIG. 1d), where closely spaced probes that are well-separated from other probes in the array tend to experience wicking. In general, probes having relatively large pitch (e.g., lateral spacing 175 μm or more) tend not to exhibit wicking, while regular probe arrays (e.g., probe array 110 on FIG. 1c) tend to be relatively well-behaved with respect to wicking (e.g., no wicking seen on a regular probe array having 110 μm probe pitch). However, it is expected that wicking in regular probe arrays is likely to be a problem for pitches of 100 μm or less. It is presently believed that wicking of the epoxies presently used for probe bonding occurs mainly during curing of the epoxy, because the elevated temperature for curing causes a temporary reduction in epoxy viscosity. This reduced viscosity enables the epoxy to more freely flow along the probes, thereby exacerbating the wicking problem.

According to embodiments of the invention, this wicking problem is alleviated by disposing an anti-wicking agent on a surface of the probe assembly such that wicking of the bonding agent along the probes toward the probe tips is hindered. The anti-wicking agent can be a solid powder, a liquid, or a gel. Once probe assembly fabrication is complete, the anti-wicking agent is removed. In preferred embodiments, a template plate is employed to hold the probe tips in proper position during fabrication. In this manner, undesirable bending of probes caused by introduction or removal of the anti-wicking agent can be reduced or eliminated.

BRIEF DESCRIPTION OF THE DRAWINGS

FIG. 3 shows an approach for prevention of inter-probe wicking according to an alternate embodiment of the invention.

FIGS. 4a-b show steps in a process for evaluating the suitability of anti-wicking materials for practicing embodiments of the invention.

FIG. 5 shows a probe tip template arrangement suitable for use with a preferred embodiment of the invention.

DETAILED DESCRIPTION

Figure 1A:
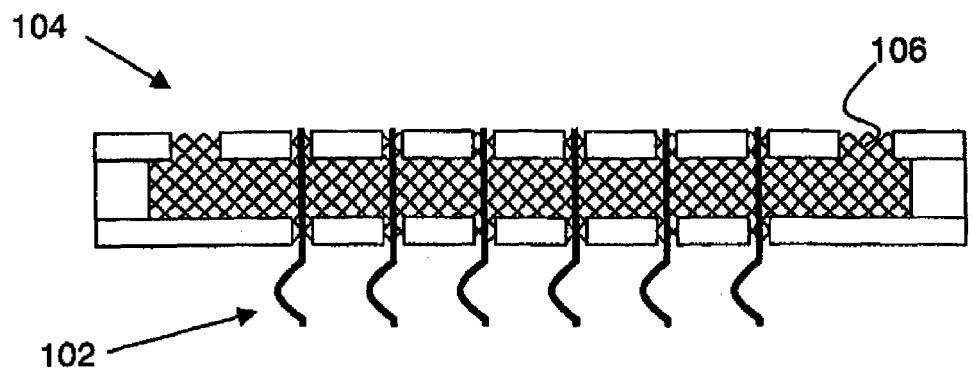
FIGS. 1a-b show a problem that can arise in connection with probe assemblies having closely spaced probes.
Figure 1B:
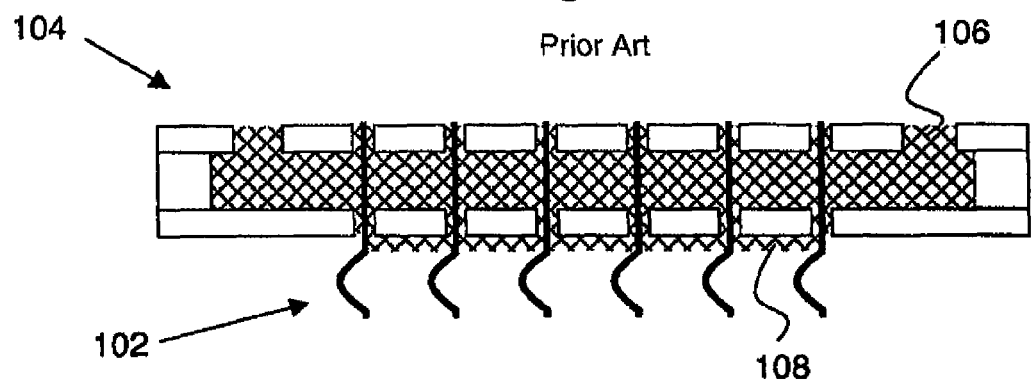
Figure 1C:
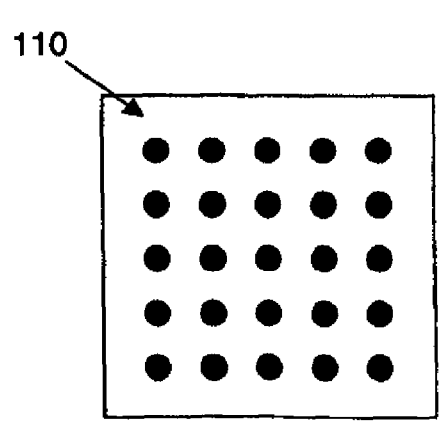
FIGS. 1c-d show examples of probe arrangements.
Figure 1D:
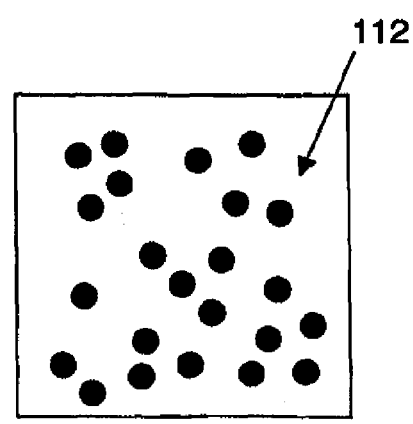

FIGS. 2a-d show steps of a probe assembly fabrication sequence according to an embodiment of the invention. On FIG. 2a, a first guide plate 202 is separated from a second guide plate 204 by a spacer 206. Guide plates 202 and 204, in combination with spacer 206, form a guide plate assembly and define a bonding cavity (i.e., the region between plates 202 and 204 and surrounded by spacer 206). Guide plates 202 and 204 include holes within which probes are disposed.

More specifically, each of probes 208 has a base section and a tip section. The base and tip sections of one of the probes are shown on FIG. 2a as 212 and 210 respectively. The base sections of the probes are disposed in the guide plate holes such that the base sections of the probes pass through the bonding cavity of the guide plate assembly. By way of example, gaps between the probes and the guide plates at the holes are typically between 5 μm and 40 μm, and lateral probe spacing is typically less than about 150 μm.

Typically, the first and second guide plates have corresponding first and second hole patterns that are aligned with each other, so that substantially straight probe base sections fit into the guide plate assembly, as shown. In most cases, all of the probe tip sections face the same way relative to the guide plate assembly, also as shown.

Figure 2A:
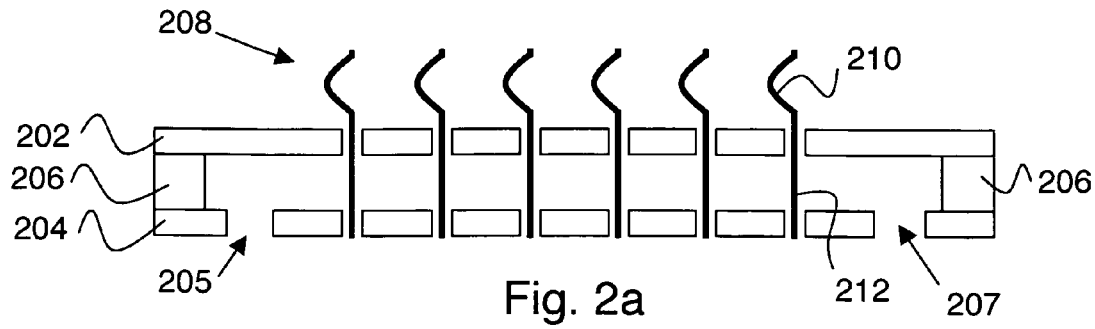
FIGS. 2a-d show steps of a probe assembly fabrication sequence according to an embodiment of the invention.
Figure 2B:
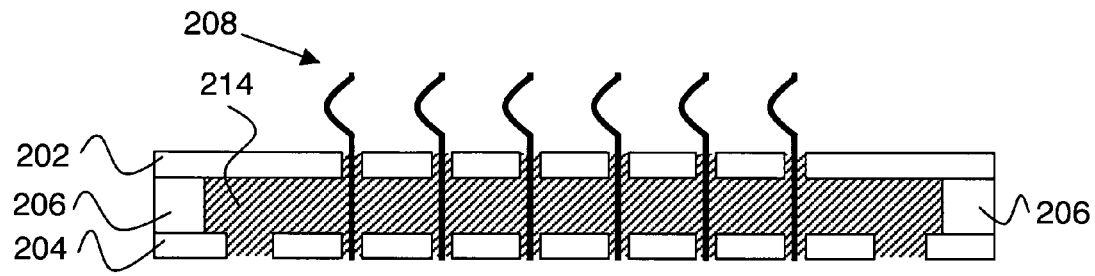

FIG. 2b shows the result of filling the bonding cavity with a curable bonding agent 214. Such filling can be performed by introducing the bonding agent through guide plate holes such as 205 and 207 on FIG. 2a. Suitable bonding agents include, but are not limited to: epoxies, thermally set materials, molten plastics and injection molding materials.

Figure 2C:
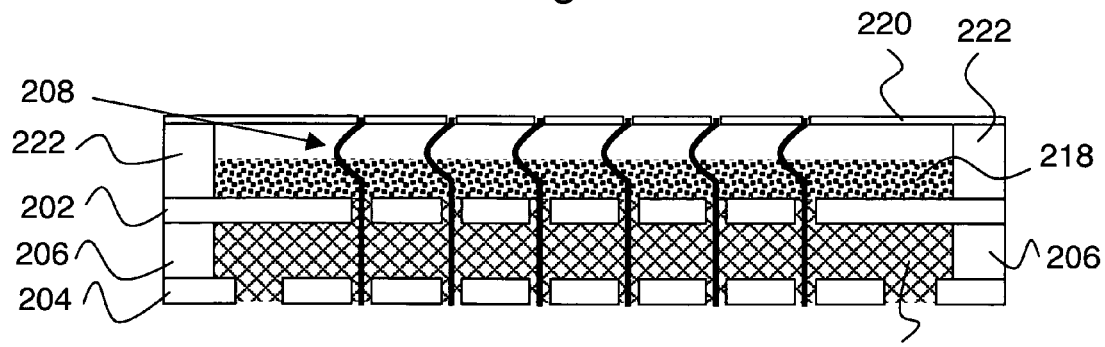

FIG. 2c shows the result of the following steps:

a) (optional) providing a probe tip template 220 (supported by a frame 222) and engaging tip sections of probes 208 with the probe tip template (e.g., as shown on FIG. 2c) before adding the anti-wicking agent;

b) disposing an anti-wicking agent 218 on a surface of the guide plate assembly facing the tip sections of the probes; and c) curing the bonding agent after disposing the anti-wicking agent. The cured bonding agent is referenced as 216. Typically, curing is performed by heating the probe assembly, although other curing processes can also be employed in practicing the invention. The bonding agent and curing process are preferably selected such that the bonding agent viscosity is lower during part of the curing step than before curing is initiated. This combination of properties facilitates elimination of bonding agent wicking according to embodiments of the invention, because wicking is suppressed at points in the process where it would otherwise be most likely to occur (i.e., during curing). Suitable materials for the optional probe tip template include polyimide, ceramics and metals.

Figure 2D:
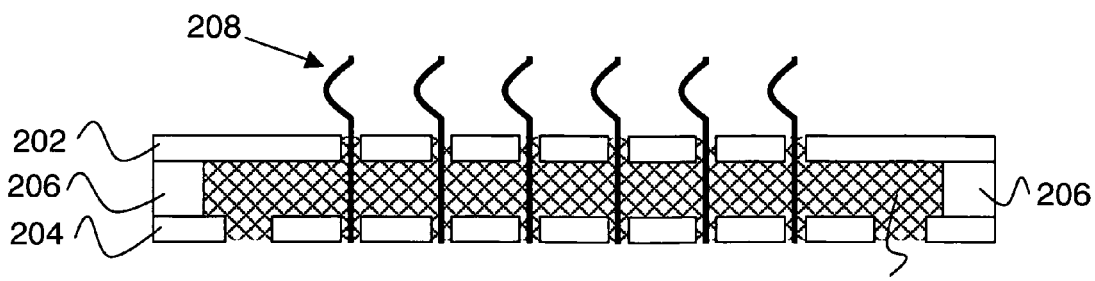

FIG. 2d shows the result of removing anti-wicking agent 218 after the bonding agent is cured (and of removing the probe tip template in cases where a probe tip template is employed). Anti-wicking agent 218 can be removed by vacuuming, and ultrasonic cleaning can be employed as a final cleaning step.

In the example of FIGS. 2a-d, anti-wicking agent 218 is a solid powder. It is important that bonding agent 214 not wick into the solid particles of anti-wicking agent 218. Various methods can be employed, individually or in combination, to reduce/prevent such wicking. For example, the particles of anti-wicking agent 218 can be compacted during deposition. Another method is to select solid powder materials having surfaces that are not wetted by the bonding agent. For example, talc and starch flour have been found to be suitable anti-wicking agents for an epoxy bonding agent. Fine powders are typically employed for the anti-wicking agent (e.g., particle size about 3 μm). A powder anti-wicking agent having ~3 μm particles has been found to be effective for blocking epoxy wicking through probe to guide plate gaps of about 20 μm. A syringe capable of delivering the solid particles (i.e., having a needle bore substantially larger than the particle size) has been found suitable for delivering and compacting the anti-wicking agent. A commercial programmable epoxy dispenser can be adapted to control the amount of applied anti-wicking powder.

FIG. 3 shows a fabrication step relating to an alternate embodiment of the invention. FIG. 3 corresponds to FIG. 2c, except that a gel or liquid anti-wicking agent 302 is used on FIG. 3 instead of the solid powder anti-wicking agent of FIG. 2c. In order for a gel or liquid to function properly as an anti-wicking agent, it is preferred that the anti-wicking agent and the bonding agent be immiscible. Suitable gel or liquid anti-wicking agents for practicing embodiments of the invention include silicone based gels and lithography compatible masking fluids. After the bonding agent is cured, the anti-wicking agent can be removed by standard lithographic processes, and accordingly it is preferred for gel or liquid anti-wicking agents to be removable in this manner. In situations where probe assembly fabrication is performed in a clean room environment, it is preferred for the anti-wicking agent to be a gel or a liquid, as opposed to a powder.

FIGS. 4a-b show steps in a process for evaluating the suitability of anti-wicking materials for practicing embodiments of the invention. In this method, a drop of uncured bonding agent 406 is disposed on a bed of a candidate material 404 on a substrate 402. The bonding agent is cured and then separated from the bed to provide a bead 408. If the surface of bead 408 is smooth and has substantially the same shape as the surface of uncured bonding agent 406 on FIG. 4a, then the bonding agent does not significantly wick into candidate material 404 as it cures, and so candidate material 404 may be a suitable anti-wicking agent. If the surface of bead 408 is rough and/or if the shape of bead 408 is substantially different than the shape of bonding agent 406 on FIG. 4a, then candidate material 404 (as prepared in this test) is not suitable for practicing embodiments of the invention. This test can be employed to evaluate the suitability of powder, liquid and gel candidate materials for practicing embodiments of the invention. It can also be used to evaluate deposition conditions, such as degree of compaction for a powdered candidate material.

FIG. 5 shows a probe tip template arrangement suitable for use with a preferred embodiment of the invention. More specifically, this figure shows a close-up view of a probe tip section 504 passing through a probe tip template 502 and having a tip 506. Preferably, tip section 504 is narrower than tip 506, as shown. The probe can move vertically with respect to the probe tip template, where tip 506 acts as a limit to keep the probe tip template from sliding off during processing. Preferably, all of the probes in the probe array have this feature which prevents the probe tip template from inadvertently sliding off the probes.

One approach for providing such a probe tip template is as follows. A probe template can be made from a polyimide sheet (e.g., 25 μm thick) with rectangular or square holes formed by laser drilling. The hole size is chosen to be slightly larger than the cross section of probe tip section 504 and slightly smaller than the cross section of probe tip 506, so the probe tip can "click" into the hole with application of a slight insertion force. After assembly and curing of the bonding agent, the template can be removed mechanically by gently pulling it off the probe tips, or chemically or via plasma etch. When mechanical removal is employed, the probe tips sometime mechanically "give" and lose alignment, so the plasma etch removal method is preferred. Plasma etching completely dissolves the polyimide template without changing probe tip alignment.

The invention claimed is

1. A method for fabricating a probe assembly comprising:
   forming a bonding cavity;
   passing a plurality of probes through the bonding cavity;
   filling the bonding cavity with a bonding agent;
   disposing an anti-wicking agent on a surface of the bonding agent in the bonding cavity; and
   curing the bonding agent in the bonding cavity; and removing the anti-wicking agent.

2. The method of claim 1 further comprising providing a guide plate assembly having a first guide plate separated from a second guide plate by a spacer, the guide plate assembly defining the bonding cavity.

3. The method of claim 2 further comprising disposing holes in the first and second guide plates.

4. The method of claim 3 further comprising disposing the probes in the holes.

5. The method of claim 4 further comprising providing gaps between the probes and the guide plates at the holes between 5 μm and 40 μm.

6. The method of claim 4 comprising lateral spacing of the probes less than about 150 μm.

7. The method of claim 3 further comprising aligning the first and second guide plates using corresponding first and second hole patterns.

8. The method of claim 3 wherein the filling the bonding cavity comprises introducing the bonding agent through the holes.

9. The method of claim 1 further comprising facing probe tip sections the same way relative to the guide plate assembly.

10. The method of claim 1 comprising boding with a material selected from the group consisting of epoxy, thermally set material, molten plastic, and injection molding material.

11. The method of claim 1 further comprising:
providing a probe tip template; and
engaging a tip section of each of the plurality of probes with the probe tip template prior to disposing the anti-wicking agent.

12. The method of claim 11 wherein the probe tip template comprises a material selected from the group consisting of polyimide, ceramic, and metal.

13. The method of claim 1 wherein curing comprises heating.

14. The method of claim 1 wherein removing the anti-wicking agent comprises vacuuming out the anti-wicking agent.

15. The method of claim 1 further comprising cleaning the probe assembly via ultrasonic cleaning.

16. The method of claim 1 wherein the anti-wicking agent comprises a powder.

17. The method of claim 16 wherein the bonding agent does not substantially wick into the powder.

18. The method of claim 1 wherein the anti-wicking agent comprises talc.

19. The method of claim 1 wherein the anti-wicking agent comprises starch flour.

20. The method of claim 1 wherein the anti-wicking agent comprises a powder having a particle size of about 3 μm.

21. The method of claim 1 further comprising compacting the anti-wicking agent.

22. The method of claim 1 wherein the disposing the anti-wicking agent is performed with a syringe capable of delivering the powder.

23. The method of claim 1 wherein the anti-wicking agent comprises a gel.

24. The method of claim 23 wherein the gel comprises a silicone based gel.

25. The method of claim 23 wherein the gel and bonding agent are substantially immiscible.

26. The method of claim 1 wherein the anti-wicking agent comprises a liquid.

27. The method of claim 26 wherein the liquid comprises lithography compatible masking fluid.

28. The method of claim 26 wherein the liquid and bonding agent are substantially immiscible.

* * * * *